(12) United States Patent
Jiang et al.

(10) Patent No.: US 7,406,178 B2
(45) Date of Patent: Jul. 29, 2008

(54) EFFICIENT DIGITAL AUDIO AUTOMATIC GAIN CONTROL

(75) Inventors: Zhongnong Jiang, Plano, TX (US); James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1089 days.

(21) Appl. No.: 09/828,116

(22) Filed: Apr. 6, 2001

(65) Prior Publication Data

US 2002/0181724 A1    Dec. 5, 2002

(51) Int. Cl.
*H03G 3/00* (2006.01)

(52) U.S. Cl. ............................... 381/107; 381/104

(58) Field of Classification Search ............... 381/312, 381/317, 104–109; 333/14
See application file for complete search history.

(56) References Cited

U.S. PATENT DOCUMENTS

| | | | | |
|---|---|---|---|---|
| 4,623,872 A | * | 11/1986 | Rainer | 341/50 |
| 4,947,133 A | * | 8/1990 | Thomas | 327/318 |
| 5,262,974 A | * | 11/1993 | Hausman et al. | 708/493 |
| 5,463,695 A | * | 10/1995 | Werrbach | 381/106 |
| 5,471,651 A | * | 11/1995 | Wilson | 455/72 |
| 5,606,625 A | * | 2/1997 | Dallavalle et al. | 381/107 |
| 5,831,880 A | * | 11/1998 | Lee | 708/319 |
| 5,832,097 A | * | 11/1998 | Armstrong et al. | 381/321 |
| 5,838,807 A | * | 11/1998 | Andersson et al. | 381/321 |
| 5,882,442 A | * | 3/1999 | Caron et al. | 148/433 |
| 5,892,834 A | * | 4/1999 | Smart et al. | 381/106 |
| 6,498,855 B1 | * | 12/2002 | Kokkosoulis et al. | 381/106 |

* cited by examiner

*Primary Examiner*—Laura A. Grier
(74) *Attorney, Agent, or Firm*—W. James Brady, III; Frederick J. Telecky, Jr.

(57) ABSTRACT

The present invention is a digital dynamic compression or automatic gain control (AGC) (10) adapted for use in high quality audio and hearing aids applications. An efficient digital AGC design employs two compact ROM-based tables (ROM_CSD, ROM_SPL) in addition to two comparators (COMP_A, COMP_B) and several registers (REG_A, REG_B, ADDR_A, ADDR_B). While one ROM stores the values of discrete input signal levels, the other contains gain codes based on a canonical signed digit (CSD) coding approach that leads to a very simple gain multiplier (20). In many cases an extremely compact table for gain values can be achieved by reusing a single small-size ROM that behaves like one that is several time larger. Two design examples are shown to expound the insights of the new digital AGC design. For the less-than-half-dB-gain-step cases only two adders are required for the multiplier whereas just three adders are needed in the situations with less than quarter-dB gain steps.

13 Claims, 1 Drawing Sheet

>>n = ARITHMETIC RIGHT SHIFT n BITS

EFFICIENT DIGITAL AUDIO AUTOMATIC GAIN CONTROL

FIELD OF THE INVENTION

The present invention relates generally to AGC control circuits, and more particularly to digital dynamic compression of AGC circuits used in high quality audio and hearing aids.

BACKGROUND OF THE INVENTION

Audio dynamic compression is an important procedure in which a large dynamic range of audio signals is compressed to better match the reduced dynamic range in impaired auditory systems. The compression can be implemented as a digital automatic gain control (AGC) that follows various rules for acceptable sound quality. In practice, these rules are expressed in functions (most likely piece-wise linear functions) that dictate the relationship between the peak (or rms) level of the input audio signals and the gain value.

What is needed is a measure of the peak level of the input signal, a compression function employed to evaluate the gain based on the peak level, and a multiplier to adjust channel gain in real time. The considerations of selecting an appropriate peak detector are usually specified by the requirements on attack time and release time. The attack (release) time may be defined as the time needed for the AGC to respond to a sudden 25-dB increase (decrease) of the input signal until the output signal is within 2 dB of the final signal level. Typically, the attack time is in the range of 0 to 10 ms, whereas the release time could be 10–100 times as large. The actual requirements of the attack or release time are usually application-dependent.

SUMMARY OF THE INVENTION

The present invention achieves technical advantages as a digital dynamic compression or automatic gain control (AGC) adapted for use in high quality audio and hearing aids applications. An efficient digital AGC design employs two compact ROM-based tables in addition to two comparators and several registers. While one ROM stores the values of discrete input signal levels, the other contains gain codes based on a canonical signed digit (CSD) coding approach that leads to a very simple gain multiplier. In many cases an extremely compact table for gain values can be achieved by reusing a single small-size ROM that behaves like one that is several time larger. Two design examples are shown to expound the insights of the new digital AGC design. For the less-than-half-dB-gain-step cases only two adders are required for the multiplier whereas just three adders are needed in the situations with less than quarter-dB gain steps.

It is assumed that the peak level of the input is already known, and an algorithm adjusting the corresponding gain begins to act when the peak level reaches some threshold, usually referred to as the compression knee. In other words, no compression is invoked when the peak levels of the input signals are smaller than the threshold. Besides the knee value, the compression function also includes a parameter called the compression ratio that controls the slope of the changing gain versus the peak level. In a digital AGC the gain step is another important parameter that determines the performance of the system. In the new design method the gain steps are not uniformly distributed and a canonical signed digit (CSD) multiplier is used. However, a maximum gain step of 0.25 to 0.5-dB is imposed in the new design, and experiments suggest that 0.25 to 0.5-dB maximally allowed step sizes are good enough for most applications. As soon as an instantaneous gain value is produced by evaluating the compression function, a simple CSD multiplier adjusts the channel gain in real time.

The compression function in the invention is based on a ROM table look-up technique. One table stores discrete sound pressure level (SPL) values, and another table contains corresponding gain values. A state machine keeps track of the peak level such that the positions of the very upper and lower SPL values are determined in one table. This in turn generates specific address information that correspondingly points to the right gain value in the other table. The table of gain values actually stores the CSD codes, not the original gain values, which make a very simple CSD multiplier feasible. Moreover, a small ROM is advantageously employed to store just a fraction of the actual gain values since the remaining gain values differ only by trivial $2^S$ scale factor (a simple shift).

DETAILED DESCRIPTION OF THE PREFERRED EMBODIMENT

System aspects of the new digital AGC will first be described, followed by two design examples to elaborate more details of the new digital AGC.

Figure 1:
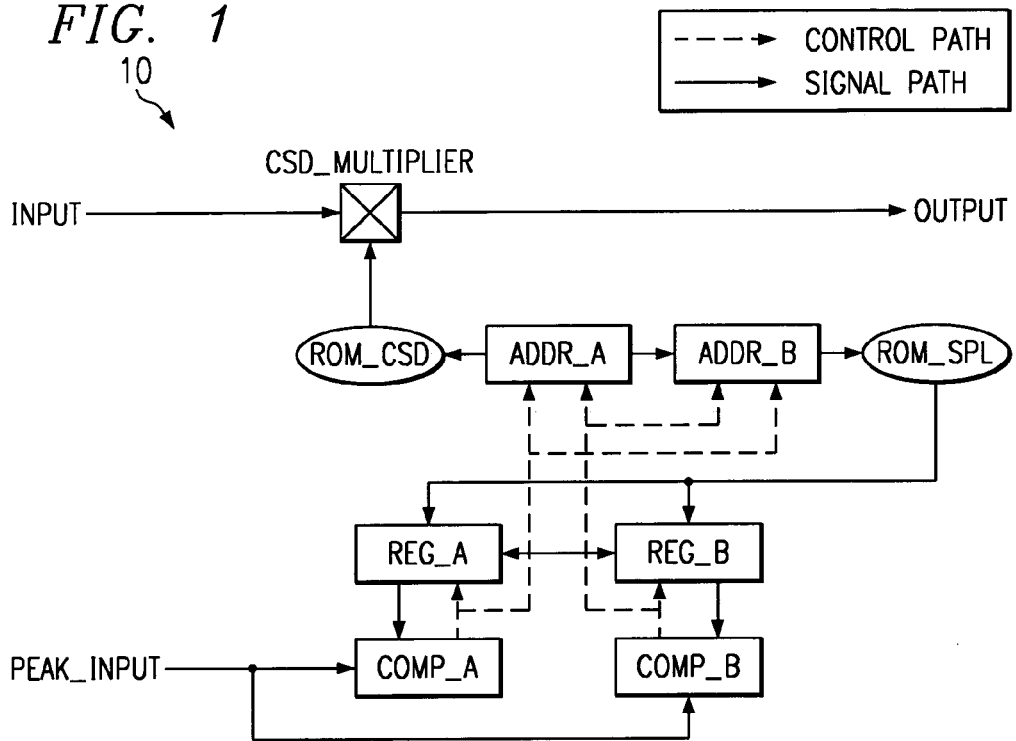
FIG. 1 is a block diagram of an AGC according to a first preferred embodiment of the invention.

A diagram of a new AGC design is shown in FIG. 1 at 10 where the main blocks are described as follows:

ROM_CSD (M×L-bits): table storing CSD codes (based on actual gain values).

ADDR_A (n-bits): address register pointing to ROM_CSD.

REG_A (K-bits): register having the lower SPL value.

COMP_A (K-bits): comparator with two inputs-peak_input and REG_A.

ROM_SPL (N×K-bits): table storing SPL values.

ADDR_B (n-bits): address register pointing to ROM_SPL.

REG_B (K-bits): register having the upper SPL value.

COMP_B (K-bits): comparator with two inputs-peak_input and REG_B.

CSD_MULTIPLY: CSD gain multiplier.

The main components of the new AGC are detailed and show how these parameters M, N(n), K and L are related and selected as follows:

The State Machine

The state machine consists of two comparators COMP_A, COMP_B and registers REG_A, REG_B, ADDR_A and ADDR_B, and its procedure is quite straightforward. The peak input, always a positive number, is a measure of the peak level of the input signal. Comparator COMP_A compares the peak input and the content of register REG_A, and comparator COMP_B compares the peak input and the content of register ADDR_B. There are three cases the state machine adjusts accordingly:

Case 1: REG_B>peak_input≧REG_A. In this case no changes are enacted in any registers of the state machine.

Case 2: peak_input<REG_A. Then the following adjustments proceed:
move (content of) REG_A into REG_B;
move ADDR_A into ADDR_B;
decrease ADDR_A by 1;

ADDR_A obtains the SPL value pointed by the new ADDR_A;

Case 3: peak_input≧REG_B. The following updates are made:
  move REG_B into REG_A;
  move ADDR_B into ADDR_A;
  increase ADDR_B by 1;
  Register ADDR_B obtains the SPL value pointed by the new ADDR_B;

Note that register ADDR_A's content minus one is the address that always points to the current gain value (CSD code) in ROM_CSD.

It is noted that register ADDR_B could be dropped since its content is just an increment of one over the content of ADDR_A. An up-counter and a multiplexer circuit can be added to obtain the correct value going into ROM_SPL. Using register ADDR_B makes the description of the state machine function more straightforward.

AGC Hysteresis

Hysteresis may be added to the digital AGC by adding a variable offset to the ROM_CSD address.
  new ROM_CSD address=original ROM_CSD address+OFFSET For P+Q steps of hysteresis the offset may be determined by augmenting the AGC state machine as follows (as corresponding, additional statements to those of the previous three cases):
  Case 1: If register ADDR_A is at its maximum (minimum) value and OFFSET is not 0, increment(decrement) OFFSET. Otherwise, leave OFFSET unchanged.
  Case 2: If OFFSET<P, increment OFFSET. Otherwise, leave OFFSET unchanged.
  Case 3: If OFFSET>−Q, decrement OFFSET. Otherwise, leave OFFSET unchanged.

With this method, the actual AGC gain with hysteresis will lag what would have been the gain without hysteresis by P steps as register ADDR_A is ramping down and Q steps as register ADDR_A is ramping up. The rule in Case 1 allows for relaxation of the hysteresis when ADDR_A reaches a terminal value.

ROM SPL

In general, table ROM_SPL has N entries (N=$2^n$). Even though the actual number of physical entries may be somewhat smaller than this power-of-two number, the address bus of ROM_SPL is n bits wide. The wordlength K of the SPL values are large enough so that adjacent SPL levels can be accurately distinguished. In one definition, if the entry number 0 (address 0) is the location where the SPL value just above the knee-SPL value is stored, register ADDR_A contains the exact address pointing to ROM_CSD. If, on the other hand, the entry number 0 (address 0) is the very location storing the knee-SPL value, the actual address pointing to ROM_CSD becomes (ADDR_A−1), and this definition is used in our design examples. Furthermore, the discrete SPL values (always positive numbers) increase monotonically with increment of the ROM address, whereas the gain values in ROM_CSD deceases monotonically.

Normally, the discrete SPL values stored in ROM_SPL can either be uniformly or non-uniformly distributed. But in this design non-uniformly distribution is more suitable since a CSD gain multiplier is used. (The magnitude distribution of CSD numbers is inherently non-uniform.) Thus, with non-uniform distribution of the discrete SPL values the maximally allowed step size on gain steps can be imposed so that the new digital AGC can achieve an equal or even better performance compared with digital AGCs having uniform gain steps. In practice 0.25 or 0.5-dB maximum gain step sizes are considered excellent and are used in the following design examples.

ROM CSD

CSD coding of binary numbers is an efficient way of performing multiplication operations. For example, a 16-bit binary number (including one sign bit) of c=0.100111001111101 equals to a sum of ten power-of-two items:

$$c=2^{-1}+2^{-4}+2^{-5}+2^{-6}+2^{-9}+2^{-10}+2^{-11}+2^{-12}+2^{-13}+2^{-15} \qquad (1)$$

When c is involved in a multiply operation there is a need of performing ten shifts and nine adds. The CSD coding on c gives:

$$c=2^{-1}+2^{-3}-2^{-6}+2^{-8}-2^{-13}+2^{-15} \qquad (2)$$

Using CSD coding as in equation (2) a multiply now degenerates to just six shifts and five adds/subtracts. To further reduce shift 6 operations, c can be expressed in a nested form as:

$$c=2^{-1}(1+2^{-3}(1-2^{-3}(1-2^{-5}(1-2^{-5}(1-2^{-2}))))) \qquad (3)$$

Or c can be described as an even more efficient, nested multiplicative form:

$$c=2^{-1}(1+2^{-2}(1-2^{-3}(1-2^{-2})(1+2^{-7}))) \qquad (4)$$

Now, a total of only four adds/subtracts are required in a multiply.

Either equation (3) or (4) may be employed to perform CSD coding of gain values in the new AGC design. Before going further, an additional constraint related to the maximally allowed shift bits is added. If the shift operation is hard wired, then no constraint need to be considered. But if the shift operation is based on a programmable shift circuitry, a limitation on the maximum shift bits in equations (3) and (4) is applied to further reduce hardware requirement.

Some more generalized expressions are now provided for efficient CSD coding in the new digital AGC as follows:

$$c=2^s(1\pm2^{-\alpha}\pm2^{-\beta}) \qquad (5)$$

$$c=2^s(1\pm2^{-\alpha}\pm2^{-\beta}\pm2^{-\gamma}) \qquad (6)$$

$$c=2^s(1\pm2^{-\alpha})(1\pm2^{-\beta}) \qquad (7)$$

$$c=2^s(1\pm2^{-\alpha}\pm2^{-\beta})(1\pm2^{-\gamma}) \qquad (8)$$

where s is an integer, and $\alpha$, $\beta$ and $\gamma$ are positive integers. When implementing CSD multipliers by using any of equations (5–8), nested multiply structure equations (3) or (4) is usually more efficient and less noisy. On the other hand, equations (7) and (8) might slightly be more efficient than using equations (5) and (6) for CSD coding. In the design examples described in the next section, it is suggested to use equation (7) for cases with the maximum gain step size of 0.5 dB and equation (8) for those having gain steps less than 0.25 dB. Moreover, constraint is imposed on the maximally allowed shift bits whenever programmable shift circuitry is required.

A novel technique for reducing the ROM size of gain values is to build a large ROM by reusing a small one. This can be done when the gain values are divided into several blocks and these blocks contain identical numbers except that they are scaled by different power-of-two digits. For example, if V denotes a vector of 16 elements (gain values) and the first and last elements of V meet a so-called circling condition. To be specific, the circling condition suggests that the ratio of the value of the first element of V over twice the value of the last element of V be less than 1, and this ratio be within a range bounded by the maximum gain step. Then, a 64-element vector can be built (a total of 64 gain values) by concatenating four 16-element vectors: $2^3V$, $2^2V$, $2^1V$ and $2^0V$. In doing so we don't have to actually erect a 64-word ROM with a 6-b address bus. Instead, only a 16-word ROM with 4-b address, achieving a 75% size-reduction compared to that of a 64-word ROM, is now implemented. The four different simple scale operations controlled by the remaining two address bits can easily be incorporated into a CSD multiplier.

CSD Multiplier

Figure 2:
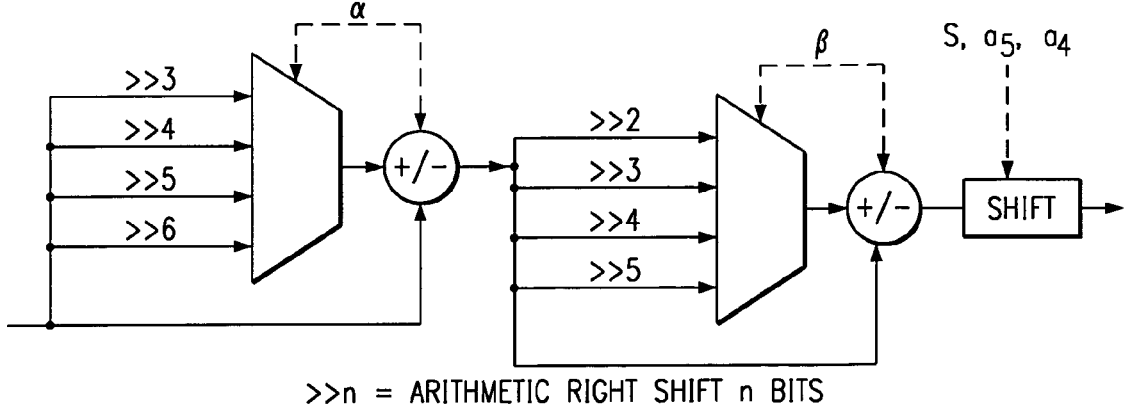
FIG. 2 is an efficient CSD multiplier.

A CSD multiplier 20 shown in FIG. 2 based on CSD coding of equations (5–8) is very simple in its hardware implementation.

DESIGN EXAMPLE #1

0.5-dB-Gain-Step Cases

In both design examples a simple compression function is used and it has three regions. The first region is called a linear region where no compression is performed. The third is a saturated region where the gain is fixed (minimal). Between these two regions is a linearly compressed region and we now assume a 64-word ROM_SPL that stores discrete SPL values is already in place. Therefore, we have M=N=64 and n=6. (The value of K is tied to the accuracy of the stored SPL values.)

Now consider using the CSD coding of equation (7) to build ROM_CSD that follows the requirement of having the maximum gain step of 0.5 dB. After studying the magnitude distribution of power-of-two digits and their combinations expressed in equation (7) a conclusion is reached on selecting the range of parameters s, $\alpha$ and $\beta$ as: s={0,1}, $\alpha$={3,4,5,6} and $\beta$={2,3,4,5}. It is obvious a CSD coding of L=7 bits is needed for s, $\alpha$ and $\beta$ (1-b for s, two sets of 2-b for the shift and two 1-b for either an add or subtract).

The advantages of the above selections for those parameters include a highly efficient CSD coding as well as relative ease in picking gain values. For a range of 6 dB gain (a gain factor of 2), a total of 12 or more gain values are needed to insure gain steps no bigger than 0.5 dB. After careful investigating, a total of 16 basic gain values (elements of V) are chosen and are summarized in Table 1:

TABLE 1

16 Basic Gain Values of V in Design Example 1.

| Addr | CSD-Form | Gain | Gain Step |
|---|---|---|---|
| 0 | $2^1(1 + 2^{-6})(1 - 2^{-4})$ | 1.904 | −0.417 dB |
| 1 | $2^1(1 - 2^{-5})(1 - 2^{-4})$ | 1.816 | −0.410 dB |
| 2 | $2^1(1 - 2^{-6})(1 - 2^{-3})$ | 1.723 | −0.460 dB |
| 3 | $2^1(1 - 2^{-4})(1 - 2^{-3})$ | 1.641 | −0.424 dB |
| 4 | $2^1(1 + 2^{-4})(1 - 2^{-2})$ | 1.594 | −0.252 dB |
| 5 | $2^1(1 + 2^{-6})(1 - 2^{-2})$ | 1.523 | −0.392 dB |
| 6 | $2^1(1 - 2^{-5})(1 - 2^{-2})$ | 1.453 | −0.410 dB |
| 7 | $2^0(1 + 2^{-3})(1 + 2^{-2})$ | 1.406 | −0.285 dB |
| 8 | $2^0(1 + 2^{-4})(1 + 2^{-2})$ | 1.328 | −0.496 dB |
| 9 | $2^0(1 + 2^{-3})(1 + 2^{-3})$ | 1.266 | −0.419 dB |
| 10 | $2^0(1 + 2^{-4})(1 + 2^{-3})$ | 1.195 | −0.496 dB |
| 11 | $2^0(1 + 2^{-5})(1 + 2^{-3})$ | 1.160 | −0.259 dB |
| 12 | $2^0(1 + 2^{-4})(1 + 2^{-4})$ | 1.129 | −0.237 dB |
| 13 | $2^0(1 + 2^{-6})(1 + 2^{-4})$ | 1.079 | −0.392 dB |
| 14 | $2^0(1 + 2^{-6})(1 + 2^{-5})$ | 1.047 | −0.259 dB |
| 15 | $2^0(1 - 2^{-5})(1 + 2^{-5})$ | 0.999 | −0.410 dB |

Notice that the gain step of −0.417 dB at Addr 0 is evaluated based on the very in value of $2^1(1-2^{-5})(1+2^{-5})$ that is exactly two times of the last gain value at Addr 15 in Table 1. Such an intentionally designed feature is the previously-described circling condition that makes a catenating of more than one vectors realizable. The maximum gain step of V (and its catenated expansion vector as well) is 0.496 dB while the minimum is just 0.237 dB.

As expected, four vectors of $2^3V$, $2^2V$, $2^1V$ and $2^0V$ can be easily catenated into a 64-entry vector. A 16-word ROM storing the gain values of V is built because the address generated by the state machine is of 6-bits, the four LSBs address this 16-word ROM whereas the two MSBs are relayed to a CSD multiplier to perform a simple scale (shift) operation.

A very efficient CSD multiplier implementing equation on (7) plus a shift related to four scale ($2^0$ to $2^3$) operations is depicted in FIGS. 2. $\alpha$ and $\beta$ (3b) control 4 shifts and one add/subtract whereas s and the two MSBs of the address selects a multi-bit shift from 0 to 7 bits.

DESIGN EXAMPLE #2

0.25-dB-Gain-Step Cases

Similar to the first design example, it is assumed M=N=64 and n=6, but equation (8) is now employed to code gain values that have gain steps smaller than 0.25 dB step. Empirical knowledge indicates that parameters s, $\alpha$, $\beta$ and $\gamma$ in equation (8) may be configured as: s={2,3}, $\alpha$={3,4,5,6} and $\gamma$={2,3,4,5}, and $\beta$ is an integer larger than $\alpha$ but which cannot exceed $\alpha$+4. Therefore, a CSD code for a gain value is L=10 bits (1-b for s, 3-b for $\beta$, 3-b for $\beta$, and 3-b for $\gamma$).

Without much difficulty, 32 possible gain values can be picked and coded based on equation (8) and are summarized in Table 2.

Notice that the largest gain step in this design example is 0.243 dB and the minimum step is just 0.123 dB. Based on the circling condition described before, the first gain step of −0.178 dB should be downward deviation from the gain value of $2^3(1-2^{-5}(1+2^{-3}))(1+2^{-5})$, which without surprise is twice the magnitude of the last gain in V of Table 2.

TABLE 2

32 Basic Gain Values of V in Design Example 2.

| Addr | CSD-Form | Gain | Gain Step |
|---|---|---|---|
| 0 | $2^3(1 - 2^{-4}(1 - 2^{-3}))(1 + 2^{-5})$ | 7.799 | −0.178 dB |
| 1 | $2^3(1 - 2^{-4}(1 + 2^{-2}))(1 + 2^{-5})$ | 7.605 | −0.218 dB |
| 2 | $2^3(1 - 2^{-5}(1 + 2^{-2}))(1 - 2^{-5})$ | 7.295 | −0.180 dB |
| 3 | $2^3(1 - 2^{-5}(1 - 2^{-3}))(1 - 2^{-4})$ | 7.295 | −0.180 dB |
| 4 | $2^3(1 - 2^{-5}(1 + 2^{-1}))(1 - 2^{-4})$ | 7.148 | −0.176 dB |
| 5 | $2^3(1 - 2^{-4}(1 + 2^{-4}))(1 - 2^{-4})$ | 7.002 | −0.180 dB |
| 6 | $2^3(1 - 2^{-5}(1 - 2^{-2}))(1 - 2^{-3})$ | 6.836 | −0.208 dB |
| 7 | $2^3(1 - 2^{-5}(1 + 2^{-1}))(1 - 2^{-3})$ | 6.672 | −0.211 dB |
| 8 | $2^3(1 - 2^{-4}(1 + 2^{-4}))(1 - 2^{-3})$ | 6.535 | −0.180 dB |
| 9 | $2^3(1 + 2^{-4}(1 + 2^{-4}))(1 - 2^{-2})$ | 6.398 | −0.184 dB |
| 10 | $2^3(1 + 2^{-4}(1 - 2^{-2}))(1 - 2^{-2})$ | 6.281 | −0.161 dB |
| 11 | $2^3(1 + 2^{-5}(1 - 2^{-2}))(1 - 2^{-2})$ | 6.141 | −0.197 dB |
| 12 | $2^3(1 + 2^{-6}(1 - 2^{-1}))(1 - 2^{-2})$ | 6.047 | −0.134 dB |
| 13 | $2^2(1 + 2^{-3}(1 + 2^{-1}))(1 + 2^{-2})$ | 5.938 | −0.159 dB |
| 14 | $2^2(1 + 2^{-3}(1 + 2^{-2}))(1 + 2^{-2})$ | 5.781 | −0.232 dB |
| 15 | $2^2(1 + 2^{-3}(1 + 2^{-4}))(1 + 2^{-2})$ | 5.664 | −0.178 dB |
| 16 | $2^2(1 + 2^{-3}(1 - 2^{-3}))(1 + 2^{-2})$ | 5.547 | −0.182 dB |
| 17 | $2^2(1 + 2^{-4}(1 + 2^{-1}))(1 + 2^{-2})$ | 5.469 | −0.123 dB |
| 18 | $2^2(1 + 2^{-4}(1 + 2^{-2}))(1 + 2^{-2})$ | 5.391 | −0.125 dB |
| 19 | $2^2(1 + 2^{-4}(1 - 2^{-3}))(1 + 2^{-2})$ | 5.273 | −0.191 dB |
| 20 | $2^2(1 + 2^{-5}(1 - 2^{-3}))(1 + 2^{-2})$ | 5.137 | −0.228 dB |
| 21 | $2^2(1 + 2^{-6}(1 - 2^{-1}))(1 + 2^{-2})$ | 5.039 | −0.167 dB |
| 22 | $2^2(1 - 2^{-6}(1 + 2^{-2}))(1 + 2^{-2})$ | 4.902 | −0.239 dB |
| 23 | $2^2(1 - 2^{-5}(1 + 2^{-2}))(1 + 2^{-2})$ | 4.805 | −0.175 dB |
| 24 | $2^2(1 - 2^{-4}(1 - 2^{-4}))(1 + 2^{-2})$ | 4.707 | −0.178 dB |

TABLE 2-continued

32 Basic Gain Values of V in Design Example 2.

| Addr | CSD-Form | Gain | Gain Step |
|------|----------|------|-----------|
| 25 | $2^2(1 + 2^{-5}(1 - 2^{-2}))(1 + 2^{-3})$ | 4.605 | −0.189 dB |
| 26 | $2^2(1 + 2^{-4}(1 - 2^{-4}))(1 + 2^{-4})$ | 4.499 | −0.203 dB |
| 27 | $2^2(1 + 2^{-5}(1 + 2^{-3}))(1 + 2^{-4})$ | 4.399 | −0.194 dB |
| 28 | $2^2(1 + 2^{-6}(1 - 2^{-2}))(1 + 2^{-4})$ | 4.300 | −0.199 dB |
| 29 | $2^2(1 + 2^{-5}(1 - 2^{-1}))(1 + 2^{-5})$ | 4.189 | −0.226 dB |
| 30 | $2^2(1 - 2^{-6}(1 - 2^{-1}))(1 + 2^{-5})$ | 4.093 | −0.203 dB |
| 31 | $2^2(1 - 2^{-5}(1 + 2^{-3}))(1 + 2^{-5})$ | 3.980 | −0.243 dB |

To build an equivalent 64-word ROM a 32-word ROM the 5 LSBs can be employed as the address bus, and the MSB of the 6-b address is fed into a CSD multiplier where an additional 1-bit programmable shift is added.

The CSD multiplier 20 in this example needs one more shift and one more add (subtract) when compared with that in Design Example 1 (see FIG. 2); therefore, the small gain steps can be achieved by using an efficient hardware implementation.

An efficient digital AGC system has been disclosed. New features achieve an efficient design, having novel advantageous properties summarized as follows:

1. A simple state machine consisting of two comparators and several registers is employed to locate the corresponding gain value based on a current measure of the peak level of the input signals. While one ROM table stores the gain values, the other contains the discrete SPL peak values.

2. The gain values are coded in CSD forms, and as a result the gain multiplier degenerates to just a couple of shift and add operations. The various CSD coding forms for this purpose have been expounded by equations (2–8).

3. A small portion of the gain values can be selected such that they satisfy the circling condition. The design examples illustrate how to reuse a small ROM to build an equivalent large ROM under this condition. The saving on the gain value ROM can be up to 75%.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. An automatic gain control (AGC) circuit, comprising:
an input adapted to receive a signal;
a compression circuit coupled to the input having a compression ratio, the compression ratio being applied to the signal exceeding a first predetermined threshold, the compression ratio being applied as a function of a predetermined signal peak level,
wherein said circuit further comprises a gain applied to the signal, which gain is not uniformly distributed to the signal,
wherein the gain comprises a canonical signed digit (CSD) multiplier;
a look-up table storing discrete sound pressure level (SPL) values and a second table storing information indicative of gain values; and
a state machine tracking a peak level of the signal such that positions of an upper and lower SPL value is determined in one table.

2. The automatic gain control circuit as specified in claim 1 wherein the gain value in the second table is a function of the state machine tracking.

3. The automatic gain control circuit as specified in claim 1 wherein the second table stores CSD codes rather than actual gain values.

4. The automatic gain control circuit as specified in claim 3 further comprising a table storing only a fraction of actual gain values.

5. An automatic gain control (AGC) circuit, comprising:
an input adapted to receive a signal;
a compression circuit coupled to the input having a compression ratio, the compression ratio being applied to the signal exceeding a first predetermined threshold, the compression ratio being applied as a function of a predetermined signal peak level,
wherein said circuit further comprises a gain applied to the signal, which gain is not uniformly distributed to the signal,
wherein the gain comprises a canonical signed digit (CSD) multiplier;
a look-up table storing discrete sound pressure level (SPL) values and a second table storing information indicative of gain values,
wherein the second table stores CSD codes rather than actual gain values; and
a table storing only a fraction of actual gain values,
wherein remaining actual gain values are determined by a scale factor.

6. The automatic gain control circuit as specified in claim 5 wherein the scale factor is a $2^S$ scale factor.

7. The automatic gain control circuit as specified in claim 5 wherein the scale factor is a simple shift.

8. An automatic gain control (AGC) circuit, comprising:
an input adapted to receive a signal;
a compression circuit coupled to the input having a compression ratio, the compression ratio being applied to the signal exceeding a first predetermined threshold, the compression ratio being applied as a function of a predetermined signal peak level,
wherein the compression circuit comprises a state machine having a first and second comparator and a first and second register, the first comparator comparing the input signal to the content of the first register and the second comparator comparing the input signal to the content of the second register,
wherein the content of the first register is moved to the second register when the input signal exceeds the first predetermined threshold.

9. The automatic gain control circuit as specified in claim 8 further comprising a third and fourth register, wherein the content of the third register is also responsively moved to the fourth register and the content of the third register is decreased by 1.

10. An automatic gain control (AGC) circuit, comprising:
an input adapted to receive a signal;
a compression circuit coupled to the input having a compression ratio, the compression ratio being applied to the signal exceeding a first predetermined threshold, the compression ratio being applied as a function of a predetermined signal peak level,
wherein said circuit further comprises a gain applied to the signal, which gain is not uniformly distributed to the signal,
wherein the gain comprises a canonical signed digit (CSD) multiplier; and a look-up table storing discrete sound pressure level (SPL) values and a second table storing information indicative of gain values, wherein the SPL values are uniformly distributed.

11. An automatic gain control (AGC) circuit, comprising:

an input adapted to receive a signal;

a compression circuit coupled to the input having a compression ratio, the compression ratio being applied to the signal exceeding a first predetermined threshold, the compression ratio being applied as a function of a predetermined signal peak level, wherein said circuit further comprises a gain applied to the signal, which gain is not uniformly distributed to the signal, wherein the gain comprises a canonical signed digit (CSD) multiplier; and a look-up table storing discrete sound pressure level (SPL) values and a second table storing information indicative of gain values, wherein the SPL values are not uniformly distributed.

12. An automatic gain control (AGC) circuit, comprising:

an input adapted to receive a signal;

a compression circuit coupled to the input having a compression ratio, the compression ratio being applied to the signal exceeding a first predetermined threshold, the compression ratio being applied as a function of a predetermined signal peak level, wherein said circuit further comprises a gain applied to the signal, which gain is not uniformly distributed to the signal, wherein the gain comprises a canonical signed digit (CSD) multiplier;

a look-up table storing discrete sound pressure level (SPL) values and a second table storing information indicative of gain values, wherein the second table stores CSD codes rather than actual gain values; and a table storing only a fraction of actual gain values, wherein the gain values are divided into blocks of numbers, the blocks being scaled with respect to each other.

13. The automatic gain control circuit as specified in claim 12 wherein the scaling of blocks is by a power-of-two.

* * * * *